United States Patent [19]

Russell

[11] 4,455,094

[45] Jun. 19, 1984

[54] MOTION APPARATUS

[76] Inventor: Robert G. Russell, 2083 Welsh Hills Rd., NE., Granville, Ohio 43203

[21] Appl. No.: 339,170

[22] Filed: Jan. 13, 1982

[51] Int. Cl.$^3$ ........................ G01R 27/22; G04B 1/26

[52] U.S. Cl. ........................................ 368/65; 200/81.8; 368/62; 368/136

[58] Field of Search ...................... 368/62, 65, 76, 134, 368/135, 136, 176, 179; 60/594; 92/91, 92; 200/81.8; 116/284; 46/41, 44

[56] References Cited

U.S. PATENT DOCUMENTS

| | | | |
|---|---|---|---|
| 3,854 | 0/1814 | Massey | 368/136 |
| 4,354 | 1/1846 | Davis | 368/62 |
| 317,225 | 5/1885 | Sexton | 368/65 |
| 359,799 | 3/1887 | Mayrhofer | 368/65 |
| 2,749,700 | 6/1956 | Seligman | 368/65 |
| 2,770,941 | 11/1956 | Flagiello | 368/65 |
| 3,065,321 | 11/1962 | Ainsworth | 200/81.8 X |
| 3,493,860 | 2/1970 | Corrsin | 368/62 X |
| 3,783,598 | 1/1974 | Parr | 368/65 |
| 3,815,352 | 6/1974 | Kiesling | 368/65 X |
| 4,028,877 | 6/1977 | Vatterott | 368/65 |
| 4,202,165 | 5/1980 | Jauch | 368/65 X |
| 4,262,348 | 4/1981 | Hess | 368/65 |
| 4,315,327 | 2/1982 | Bremer | 368/65 |
| 4,372,688 | 2/1983 | Chatten | 368/65 |

FOREIGN PATENT DOCUMENTS

| | | | |
|---|---|---|---|
| 1915 | of 1915 | United Kingdom | 368/136 |

*Primary Examiner*—J. V. Truhe
*Assistant Examiner*—Terry Flower
*Attorney, Agent, or Firm*—Allen D. Gutchess, Jr.

[57] ABSTRACT

Apparatus is provided for moving an object in an oscillatory manner and in an arcuate path through the use of a fluid. The apparatus basically includes a hollow member or elongate tube having a curved portion and means for supplying fluid in pulses or at an increasing rate and then at a decreasing rate of flow to the tube on one side of the curved portion. The change in velocity of the fluid and the rate of change cause the movement of the tube due to inertia and, to a lesser extent, friction of the moving fluid within the tube. The density of the fluid also has a substantial effect on the movement of the tube, although gas alone will cause movement. The object to be moved is engagable by the tube and is usually supported by it. The object moved by the tube and fluid can take many forms, including signs, ornaments, figures, chimes, and clock dials.

33 Claims, 14 Drawing Figures

MOTION APPARATUS

This invention relates to apparatus for moving an object in an oscillatory manner through the use of an elongate tube and means for supplying fluid to the tube in pulses.

It has been found that an oscillatory or arcuate movement of an elongate tube having a curved or U-shaped portion can be achieved by supplying a fluid to the tube toward the curved portion at an increasing rate of flow and then at a decreasing rate of flow with the fluid moving toward the curved portion as the rate of flow increases. The change in velocity and the rate of change cause this movement because of inertia and, to some extent, because of the effect of friction of the moving fluid with the tube. The density of the fluid also is a decided factor, with a liquid causing a greater movement or more forceful movement of the tube than a gas, for example. More than one fluid can also be employed.

A liquid can be located within the curved portion of the tube with gas supplied in pulses to an open end of the tube. The opposite end of the tube can be open, or closed, with gas trapped between the liquid and the closed end providing a spring effect for returning the liquid toward the open end. Alternately, a spring-loaded piston can be located at the closed end of the tube in place of the trapped gas. In any event, the viscosity of the liquid should be low to provide quick or easy movement of the liquid in the tube. As a practical matter, air and water are the preferred fluids for effecting the tube movement. Where liquid is used, it can be colored for visual enhancement and a detergent can be employed in the liquid to minimize dust and dirt. When the apparatus is used in freezing temperatures, a mixture of 50% permanent antifreeze and 50% water can be used, if desired. When liquid alone is used as the fluid, both ends of the tube can be open with the liquid squirting from the exhaust end to create a fountain effect, by way of example. A portion of the water can also be emitted from small holes in an intermediate portion of the tube to provide a fountain or similar decorative effect.

Objects which are animated or moved by the tube can be of a wide variety. Such objects include signs which can move in an arcuate path to attract more attention. The objects can also be moving targets, chimes, bells, and various ornaments, including Christmas tree ornaments. The objects can also be of specific shapes such as puppets, dolls, animals, or balls in which the tube is embedded to provide animation for the object.

A particularly striking application of the invention is a large pendulum clock in which the clock dials are located at the lower free end of the pendulum. The clock dials swing back and forth in place of the usual pendulum and appear to be operable without any obvious mechanism. Such clocks can be huge in size with dials measuring several yards in diameter for locations in large areas such as large office building lobbies, hotel lobbies, airports, sports arenas, auditoriums, etc.

It is, therefore, a principal object of the invention to provide a novel motion apparatus which includes an elongate tube having a curved portion and means for supplying fluid at an increasing rate of flow and then at a diminising rate of flow to the tube on one side of the curved portion to cause movement of at least the curved portion of the tube.

Another object of the invention is to provide apparatus for moving an object in an arcuate path with the object engagable by a tubular member having a curved portion and with means for supplying fluid in pulses to the member.

A further object of the invention is to provide apparatus for providing movement to an object without the use of obvious mechanical drive components.

Still another object of the invention is to provide a clock which moves in an oscillatory manner and has dials which rotate without obvious mechanical components.

Many other objects and advantages of the invention will be apparent from the following detailed description of preferred embodiments thereof, reference being made to the accompanying drawings, in which.

Figure 1:
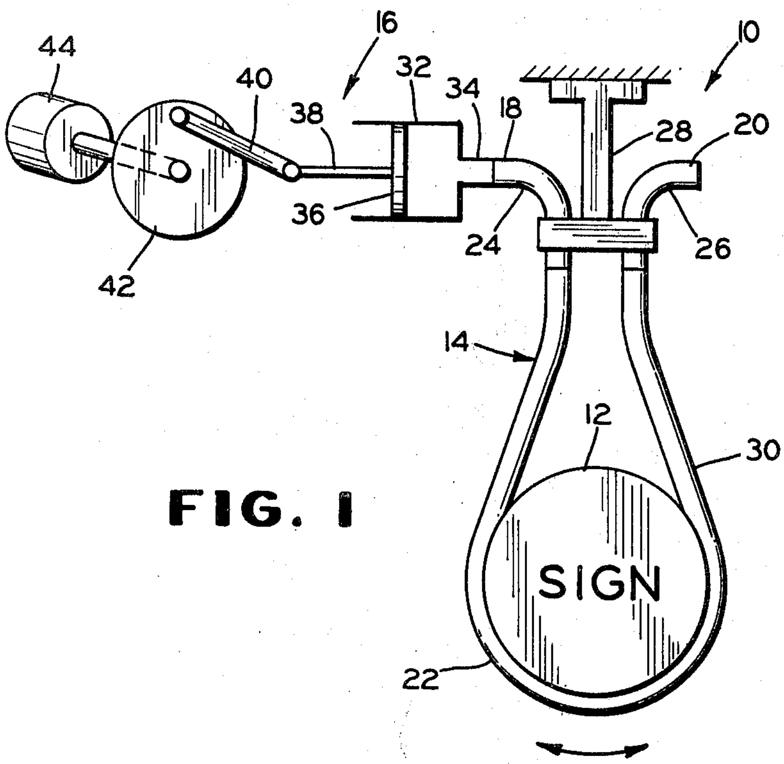
FIG. 1 is a schematic view in elevation of apparatus, including a flexible tube, in accordance with the invention for imparting arcuate movement to an object in the form of a sign.

Referring now to FIG. 1, apparatus is indicated at 10 for imparting motion to an object 12 in the form of a circular sign. The apparatus 10 basically includes an elongate hollow member or tube 14 and means indicated at 16 for supplying fluid in pulses or at increasing and then decreasing rates of flow to the member. The hollow member tube 14 includes a supply end 18 and an exhaust or receiving end 20, with a generally U-shaped portion 22 therebetween. The U-shaped portion 22 in this instance is shown as having a curved lower end but this is not essential to the operation of the invention. The curved portion, in this instance, provides a convenient support for the circular sign 12 which can have a peripheral groove in which the curved portion 22 is partially inserted and adhered. However, other means can be provided to enable the hollow member 14 to engage the object 12 in order to provide motion for the object when the hollow member 14 is moved. In this instance, the hollow member 14 has rigid end tubes 24 and 26 held by a suitable support 28 and has a flexible tube 30 connected with the lower ends of both of the end portions 24 and 26, forming the U-shaped portion 22, and being capable of oscillating or moving in arcuate paths relative to the end portions.

The fluid supply means 16 can be of various designs. As shown, it includes a cylinder 32 having a spout 34 at the blind end connected with the supply end 18 of the hollow member 14. A piston 36 reciprocates in the cylinder 32, being connected to a piston rod 38 which, in turn, is pivotally connected to a crank arm 40 which is pivotally mounted on a cam 42 rotated by a suitable motor 44. When the cam 42 rotates in a clockwise direction from the position shown, the piston 36 moves toward the blind end of the cylinder 32, compressing gas therein and supplying it into the hollow member 14 toward the U-shaped portion 22. The gas is supplied in a pulse which increases in volume and rate of flow as the piston moves from the rod end of the cylinder toward the blind end and then at a decreasing rate of flow as the piston approaches the blind end of the cylinder. This flow of gas through the hollow member 14 causes the sign to move in an arcuate path. As the cam 42 continues to rotate and the piston 36 moves back toward the rod end of the cylinder, the gas flow through the hollow member is reversed with the reverse flow first increasing in volume and rate of flow and then decreasing as the piston nears the rod end of the cylinder. The object or sign 12 then moves along with the hollow member 14 in an arcuate path in the opposite direction so that with one rotation of the cam member 42, the object and hollow member oscillate from one extreme to the other and then back again to the original position. This movement of the object is in a plane parallel to the curved portion 22 of the hollow member as long as the ends of the tube 30 are in the same plane. If the ends of the member are offset transversely of the general plane of the U-shaped portion 22, then the object will move with a twisting motion instead of the true arcuate one.

If desired, one or more additional ones of the signs 12 can be placed in series with the one shown. In that instance, the supply end 18 of another one of the hollow members 14 can communicate with the receiving end 20 of the first member to provide similar pulses to the next sign to cause it also to move in an arcuate path and in an oscillatory manner.

Figure 2:
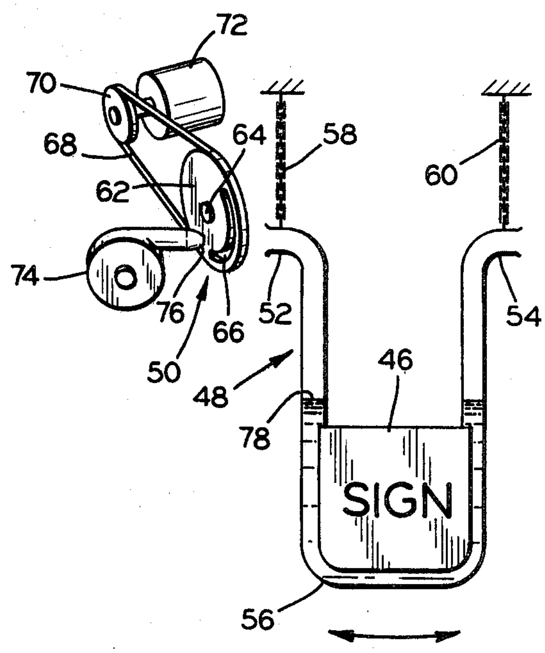
FIG. 2 is a schematic view in elevation of apparatus, including a rigid tube, in accordance with the invention for imparting arcuate movement to an object.

Referring to FIG. 2, an object to which movement is imparted is indicated at 46 and is shown as a generally square sign. The square sign 46 is moved by an elongate hollow member 48 to which pulses of fluid are supplied by a fluid-supply means 50. The hollow member 48 has an open supply end 52 and an open exhaust or receiving end 54 with a U-shaped portion 56 therebetween, the U-shaped portion having a substantially squared lower end in this instance. The hollow member 48 is entirely composed of a rigid tube with the ends 52 and 54 supported by suitable chains or other flexible members 58 and 60 to allow movement of the hollow member 48 in a shallow arcuate path with an oscillatory motion.

The fluid supply means 50 in FIG. 2 includes a slotted disc 62 rotatably supported on an axle 64 and having an arcuate slot 66. The disc 62 can be driven by suitable means such as a V-belt 68, a pulley 70, and a motor 72. A suitable blower 74 has a nozzle 76 aligned with the supply end 52 of the hollow member 48 with the arcuate slot 66 positioned therebetween as the disc 62 is rotated. When the slot 66 is aligned with the nozzle 76 and the supply end 52, fluid is supplied at a suddenly increasing rate of flow and subsequently a suddenly decreasing rate of flow to the hollow member 48 to provide a comparatively flat pulse of fluid as compared to the pulse supplied by the supply means 16 of FIG. 1.

The fluid can be a gas as in FIG. 1 but the hollow member 48 also can have a second fluid in the form of liquid 78 in the U-shaped portion 66. The gas pulse acts on the liquid 78 and moves it accordingly toward the receiving or exhaust end 54 of the tube. This sudden movement of the second fluid or liquid also aids in imparting motion to the object or sign 46 with the liquid being denser and imparting stronger or longer movement.

Figure 3:
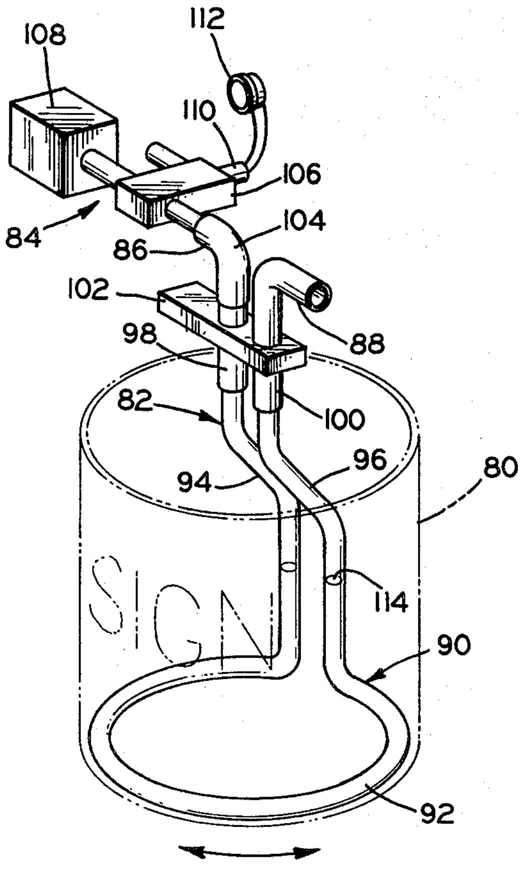
FIG. 3 is a schematic view in perspective of apparatus, including a different tube, in accordance with the invention for imparting arcuate movement to an object.

Referring now particularly to FIG. 3, an object 80 in the form of a cylindrical sign is shown in dotted lines. The object 80 is contacted by an elongate hollow member or tube 82 which is supplied with fluid by fluid-supply means 84. The hollow member 82 has a supply end 86 and an exhaust or receiving end 88 with a generally U-shaped portion 90 therebetween. The generally U-shaped portion 90, in this instance, has an enlarged, curved horizontal portion 92 and upright leg portions 94 and 96 extending upwardly, then slanting inwardly toward the center of the of the sign 80 and then upwardly again through bearings 98 and 100 depending from a suitable support 102. The leg 94 is connected to a flexible tube 104 above the support 102 to form the supply end 86 while the upper end of the leg 96 is simply bent above the support 102 to form the receiving end 88 of the hollow member 82.

The fluid supply means 84 in FIG. 3 includes a three-way valve 106 having its outlet connected to the flexible tube 104 and having an inlet connected to a suitable source 108 of fluid under pressure. The valve 106 is open and closed by a solenoid 110 which is actuated periodically by a suitable timer 112. p The U-shaped portion 90 of the elongate member 92 again has liquid 114 therein which is moved toward the receiving end 88 of the hollow member when the supply means 84 supplies fluid to the supply end 86 of the hollow member 82 when the valve 106 is opened. Liquid is then suddenly moved toward the receiving end of the member and causes oscillation of the object 80, this time in an arcuate horizontal direction. When the valve is closed, the supply end is connected to a vent of the three-way valve to enable the liquid 114 to move back toward the supply end of the hollow member, causing the object 80 to oscillate in the opposite direction. During the oscillatory movement of the object, the legs 94 and 96 of the hollow member pivot in the bearings 98 and 100 which are close together and, with a certain degree of flexibility of the hollow member, enable a pivotable support to be achieved for the object or sign.

Figure 4:
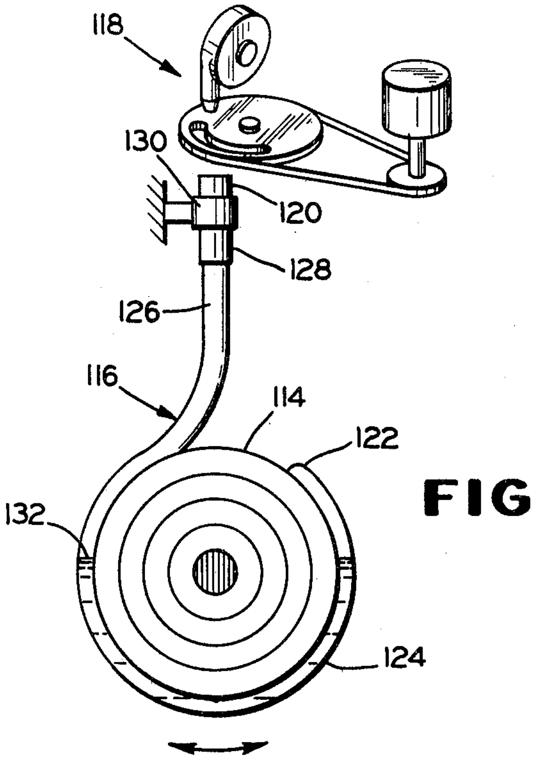
FIG. 4 is a schematic view in elevation of apparatus, including a closed end tube, in accordance with the invention for imparting movement to an object.

Referring now to FIG. 4, an object 114 is shown specifically in the form of a swinging target which can also be a sign or an ornament, etc. The object 114 is supported by an elongate hollow member 116 to which fluid is supplied by fluid supply means 118. The elongate hollow member 116 has a supply end 120 and a receiving end 122 which is closed in this instance. A generally U-shaped portion 124 is located between the ends 120 and 122 having an upright leg 126 connected to a flexible tube 128 held by a support 130 with the upper end of the tube 128 forming the supply end 120 of the hollow member 116.

The fluid supply means 118 is shown as being substantially the same as that of FIG. 2 and will not be discussed in detail. Of course, the various fluid supply means can be interchanged with the various hollow elongate members and still impart the desired motions to the objects held by the hollow elongate members.

In this instance, liquid 132 is also located in the U-shaped portion 124 of the member 116. When a pulse of gas is supplied to the supply end 120 of the member, the fluid 132 moves toward the receiving end 122 and compresses gas between the liquid and the end of the tube. The compressed, trapped gas then forces the liquid 132 back toward the supply end 120 of the member 116 when the pulse of gas is stopped. An arcuate, oscillatory movement of the object 114 thereby results with the member 116 pivoting around the flexible tube 128. A piston and spring can be located in the portion of the member 116 near the receiving end 122 to constitute resilient means functioning similar to the trapped gas therein, if desired. Further, if liquid is supplied to the hollow member 116 from the supply means 118 and the end 122 is open, the liquid can squirt out this end to form a decorative effect, with the liquid then being the only fluid employed.

Figure 5:
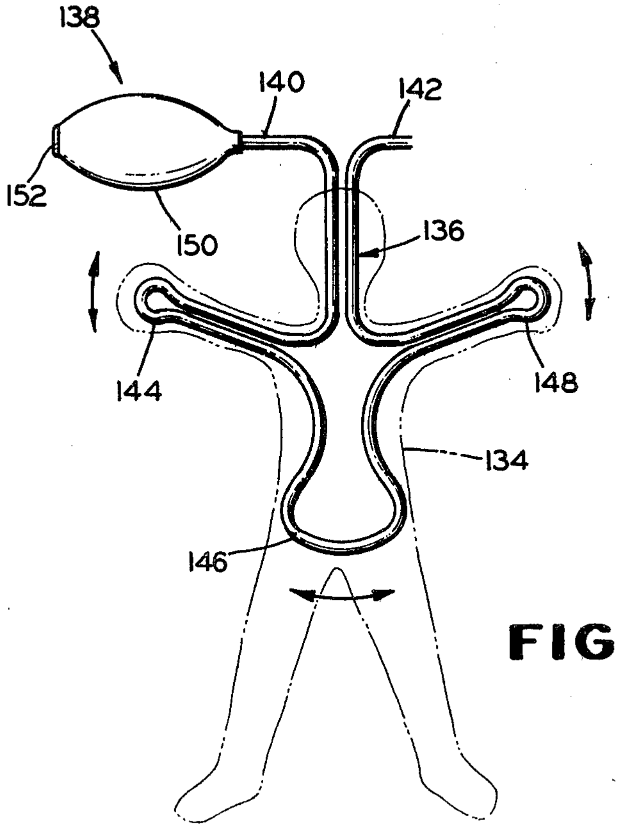
FIG. 5 is a schematic view in elevation of apparatus, including a tube with multiple curved portions, in accordance with the invention for imparting movement to an object in the form of a figure.

Referring now to FIG. 5, an object 134 is shown as a figure of flexible material such as rubber or plastic and specifically is shown in human form. A flexible hollow elongate member 136 is mostly enclosed within the figure 134 and is supplied with fluid by supply means 138. The hollow member 136 has a supply end 140 and an exhaust or receiving end 142 with three generally U-shaped portions 144, 146, and 148 therebetween. These three portions are located in an arm, the seat, and another arm, respectively, of the figure 134 and impart arcuate, oscillatory motions to the corresponding portions of the figure when the hollow member receives pulses to fluid.

The supply means 138 in FIG. 5 includes a hollow rubber bulb 150 with an end check valve 152 and supplies pulses of air to the hollow member 136 when the bulb is squeezed. The supply means 138 can be of the type used with nasal sprays, atomizers, and perfumizers, as is known in the art. The hollow member 136 can be supported by a suitable bracket or can be hand held or hung from an overhead support.

Figure 6:
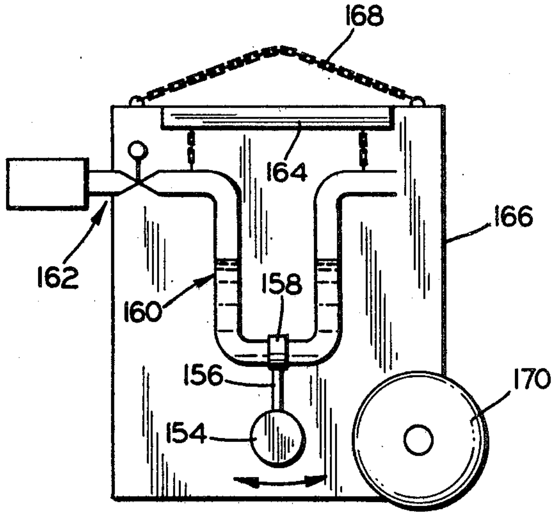
FIG. 6 is a schematic view in elevation of apparatus in accordance with the invention for imparting movement to an object in the form of a striker for chimes.

Referring now to FIG. 6, an object in the form of a striker 154 is supported through a stem 156 and a band 158 by an elongate hollow member 160 supplied with pulses of fluid by supply means 162. As shown, the hollow elongate member 160 is similar to that of FIG. 2 and the supply means 162 is similar to the supply member 84 of FIG. 3; hence, they will not be discussed in detail. The hollow elongate member 160 is supported by an overhead flange 164 extending outwardly from a mounting board 166 which can be hung by a chain 168 from a Christmas tree branch, by way of example. When the fluid pulses are supplied to the hollow member 160 from the supply means 162, oscillation of the member causes the striker 154 to strike a gong 170 which is also mounted on the mounting board 166 to provide a pleasant tinkling sound.

Referring now to FIGS. 7–10, a decorative pendulum clock embodying the invention is indicated at 172. The clock includes an object 174 in the form of a supporting member or disc engaged by a rigid, hollow, elongate member 176 communicating with supply means 178 for supplying fluid to the member. The hollow elongate member 176 includes two ends 180 and 182, each of which constitutes both a supply and an exhaust or receiving end. The member 176 has a generally U-shaped portion 184 between the ends, with the U-shaped portion having a curved lower end 186 with a radius about equal to that of the supporting disc or object 174. The U-shaped portion 184 has two upright legs 188 and 190 extending upwardly and inwardly from the curved lower portion 186. The legs 188 and 190 converge toward a fulcrum axis "X" for the clock but diverge and form bowed portions 192 and 194 prior to reaching the fulcrum axis and terminate at the ends 180 and 182, which are mutually perpendicular.

The supporting disc 174 has a peripheral groove 196 (FIG. 10) therein in which the lower curved portion 186 of the U-shaped portion 184 of the hollow member 176 is affixed. A pin 198 with bushing sleeves 200 and spacer washers 202 are centrally located with respect to the supporting disc 174 and rotatably support two spaced discs or dials 204 and 206 on either side of the supporting disc. A minute hand 208 (FIG. 7) is marked on the front disc 204 to indicate minutes and an hour hand 210 (FIG. 9) is marked on the rear disc 206 to indicate hours, with hour indicia (FIG. 8) being marked on the center supporting disc 174. All three of the discs are of transparent material, such as clear plastic. The front disc 204 has angularly-shaped teeth 212 and the rear disc has similar angularly-shaped teeth 214 which, however, may have different spacing than the teeth 212.

The minute and hour dials 204 and 206 are rotated to tell the time of day regardless of whether or not the supporting disc 174 is in motion. For this purpose, a thin push rod 216 (FIG. 7) has a lower end engaging the teeth 212 in the disc 204 and an upper end suitably affixed to a pivot pin 218 which is substantially in alignment with the fulcrum axis "X", usually being slightly above or below the axis, depending upon the position of a lever arm 220 which pivotally supports the pin 218 at its outer end. A thin drag rod 222 has a pad 224 at its lower end engagable with the periphery of the disc 204 on the side opposite the push rod 216 with the drag rod 220 being independently pivotally supported near the pin 218. A tension spring 226 extends between the rods 216 and 222, preferably at upper portions where it is hidden by a frame or case within which the dials are enclosed but are exposed. The drag rod 222 through the spring 226 urges the lower end of the push rod 116 against the teeth 212 of the disc 204 so that the next tooth engaged and moved downwardly when the rod 216 is raised and lowered by the pivot pin 218. The drag rod 222 also, through the pad 224, places a frictional drag on the disc 204 to control movement of the disc. Particularly with larger clocks, the discs 204 and 206 tend to remain in vertical positions when they move in an arcuate or oscillatory manner from one extreme to the other and could tend to turn counterclockwise if the movement were not controlled through the rods 216 and 222.

To move the rod 216 up and down, the lever 220 has a drive rod 228 pivotally attached at the end opposite the pivot 218 with a fulcrum support 230 located therebetween. The drive rod 228 is pivotally attached to the lever and pivotally attached to a crank arm 232 of a synchronous motor 234. The rotation of the motor 234 and the number of the teeth 212 are designed to cause the disc 204 to make one complete revolution in an hour. For example, there can be sixty of the teeth 212 with the synchronous motor 234 rotating the crank arm 232 once each minute and advance the disc one notch each minute regardless of whether the discs are still or oscillating.

Figure 7:
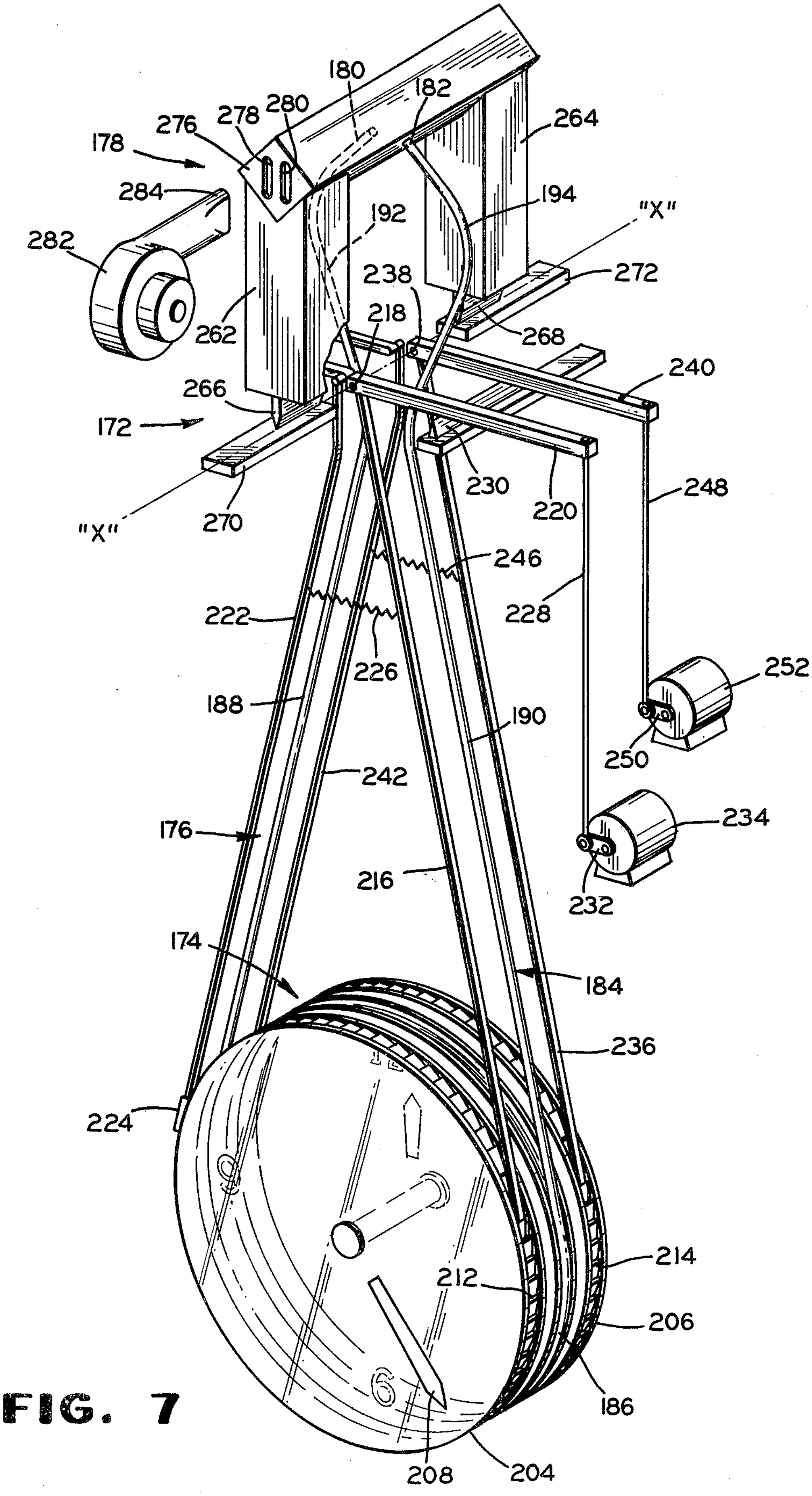
FIG. 7 is a somewhat schematic view in perspective of a clock embodying the invention.
Figure 8:
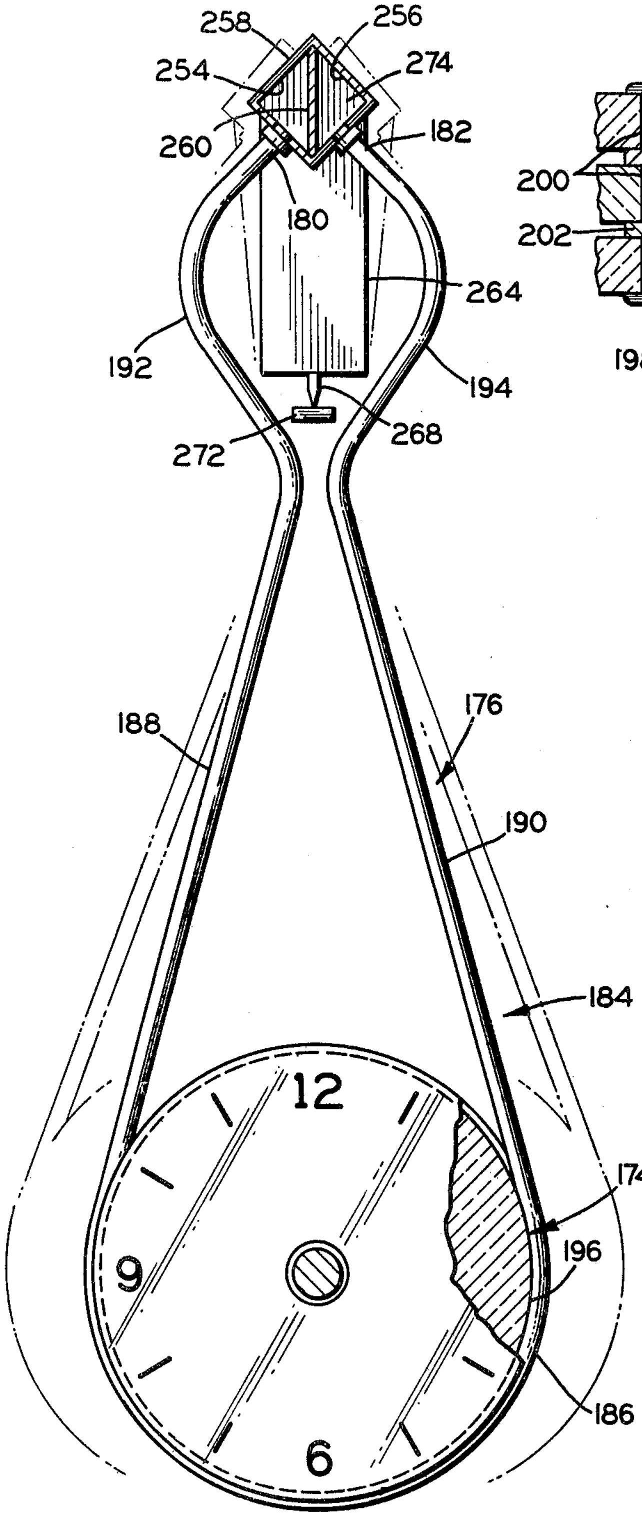
FIG. 8 is a front view in elevation, with parts broken away and with parts in cross section, of part of the clock of FIG. 7.
Figure 10:
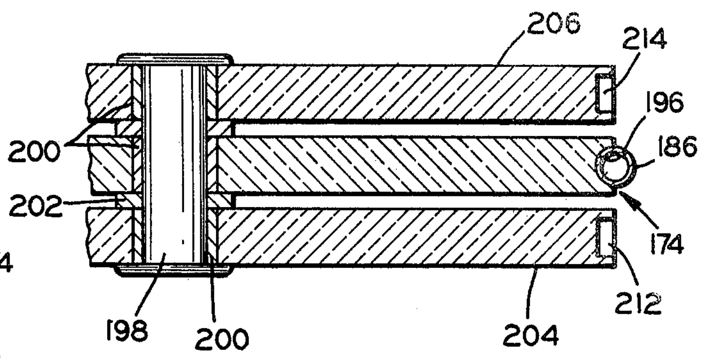
FIG. 10 is an enlarged, fragmentary view in horizontal cross section taken through dials of the clock of FIGS. 7–9.
Figure 9:
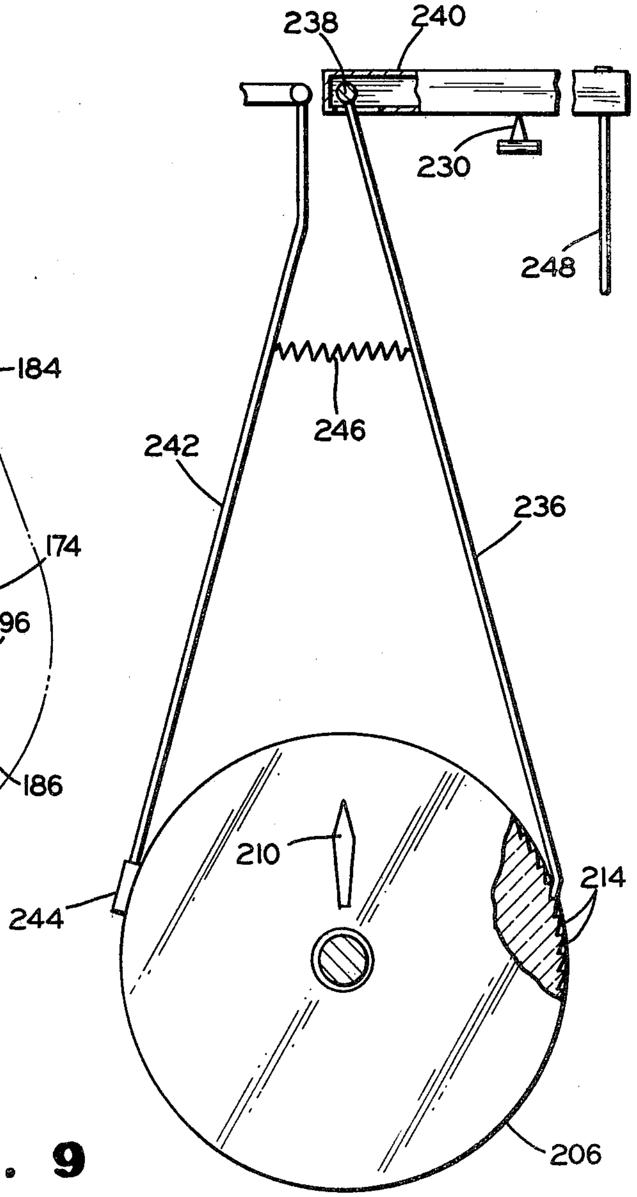
FIG. 9 is a schematic view in elevation, with parts broken away and with parts in cross section, of other parts of the clock of FIG. 7.

Referring to FIGS. 7-9, the hour disc 206 is moved by mechanism similar to that for the minute disc 204. This includes a push rod 236 engaging the teeth at the lower end and attached to a pivot pin 238 at the upper end pivotally supported by one end of a lever 240. A drag rod 242 with a pad 244 is independently pivotally supported near the pin 238 and engages the disc 206 on the side opposite the push rod 236. The rods are urged together by a tension spring 246 to maintain the lower end of the push rod 236 against the teeth 214 with the pad 244 inhibiting unwanted movement of the hour disc 206. The lever 240 also has a drive rod 248 pivotally connected to the lever 240 on one side of the fulcrum support 230, with the lower end of the rod 248 pivotally connected to a crank arm 250 of a synchronous motor 252. The design of the teeth 214 and the synchronous motor 252 are such as to advance the hour dial 206 through one complete revolution once every twelve hours or once every twenty-four hours.

The push rods 216 and 236 preferably are in alignment and also in alignment with the leg 190 of the hollow member 194. The drag rods 222 and 242 are in alignment and also in alignment with the leg 188 of the member 194. This enables the thin rods to be partly hidden and substantially unnoticed. The levers 220 and 240 along with the drive links and motors 234 and 252 are also hidden by the clock frame or cabinet from the observer. Of course, the fluid supply means 178 is also hidden from the observer.

The fluid supply means 178 for supplying fluid through the hollow member 184 includes two manifold chambers 254 and 256 (FIG. 8) which are formed by a diamond shape housing 258 and a central divider or partition 260. The housing 258 is affixed to two end supporting posts 262 and 264 (FIGS. 7 and 8) having fulcrum blades 266 and 268 extending downwardly from the lower ends and supported on fulcrum plates 270 and 272. The blades engage the plates along the fulcrum axis "X". The rear end of the housing 258 is closed by an end wall 274 while the front end of the housing has a slotted end wall 276 having openings or slots 278 and 280 communicating with the manifold chambers 254 and 256, respectively. A suitable gas source or blower 282 has an elongate nozzle 284 positioned to be aligned with the slot 278 when the object or discs are toward one end or extremity of the arcuate path and to be similarly aligned with the slot 280 when the object or discs are toward the other extremity of their arcuate path. With the nozzle 284 aligned with the slot 278, fluid is supplied to the manifold chamber 254 and through the end 180 of the hollow member 184 with the end 180 serving as a supply end. The end 182 of the member 184 then serves as an exhaust end. The opposite is true when the nozzle 284 is aligned with the slot 280.

Since the advancement of the minute and hour dials 204 and 206 is independent of the oscillatory motion thereof, no special provisions need be made to provide synchronization of the oscillatory motion and time. If the oscillatory motion is synchronous with time, for example, each swing from one extremity to the other extremity of the arcuate path being exactly five seconds, then mechanical means can be used to advance the dials 204 and 206. For example, a gear rack and detent mechanism could be located at the lower extremities of the dials to rotate them a predetermined amount during each oscillatory, full cycle movement of the dials from one extremity to the other and back again.

Of course, liquid can be employed in the U-shaped portion 184 of the hollow member 176 to provide stronger movement, if desired. Such liquid can be colored or made fluorescent, by way of example.

If desired, counterweights can be used to replace the discs and the clock dials and supporting discs then mounted above the fulcrum axis "X". The other basic components would still be used, but upside down. In that instance, both the dials and the counterweights could be exposed to the observer through the clock frame or cabinet with most of the mechanical components hidden by a broad horizontal band across the middle portion of the frame or cabinet.

Figure 11:
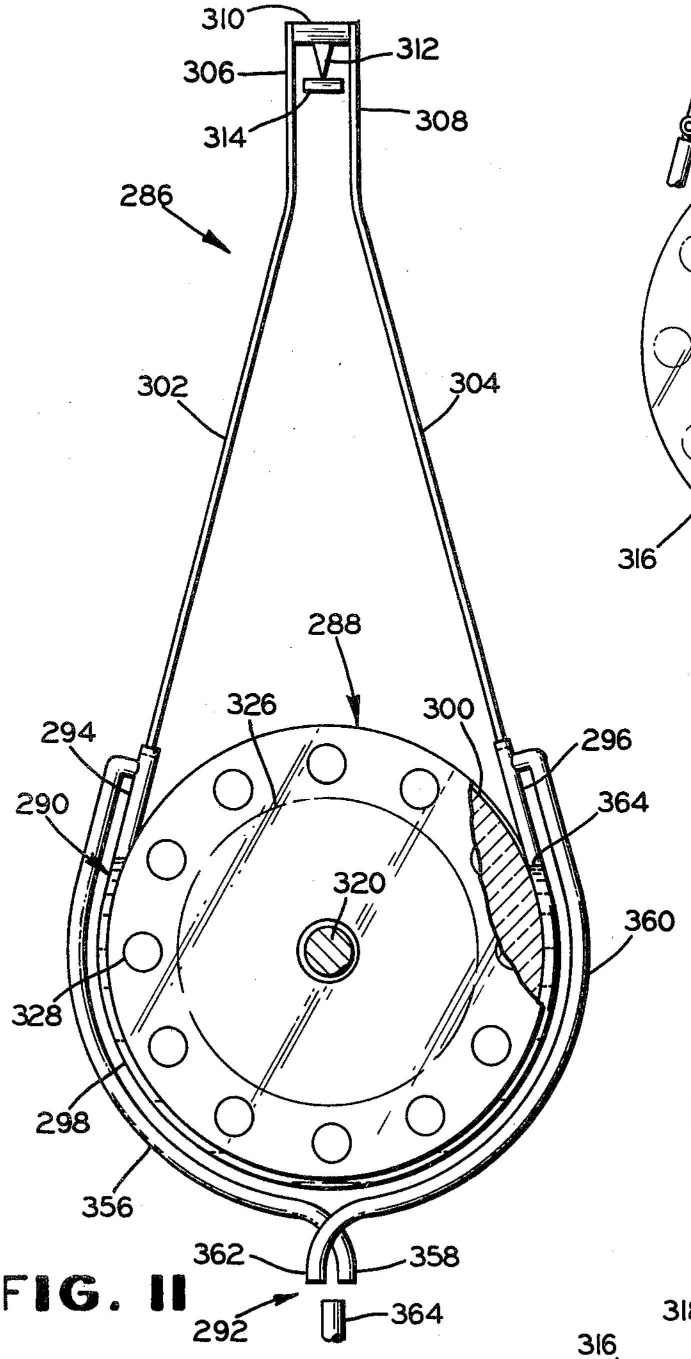
FIG. 11 is a somewhat schematic view in elevation of parts of a modified clock.

Referring to FIGS. 11-14, a modified clock 286 is shown. An object in the form of a supporting member or disc 288 is moved in an arcuate, oscillatory manner, being engaged by an elongate hollow member 290 which is moved by fluid supply means 292 (FIG. 11). The hollow elongate member 290 has a supply and exhaust or receiving end 294 and an exhaust or receiving and supply end 296 connected by a substantially U-shaped portion 298. This is received in a peripheral groove 300 in the supporting disc 288. The hollow member 290 is supported by two pendulum rods 302 and 304 extending upwardly from the upper ends of the hollow member 290 toward a fulcrum axis but bending to form vertical legs 306 and 308 which are connected by a web strut 310 having a fulcrum blade 312 supported on a fulcrum plate 314.

The clock discs include two outer minute discs or dials 316 (FIG. 4) and two inner hour discs or dials 318 to provide the visual indication of time from each side of the clock 286. The discs are rotatably supported by the center disc 288 through an axle pin 320 along with sleeve bearings 322 and spacer washers 324.

Figure 12:
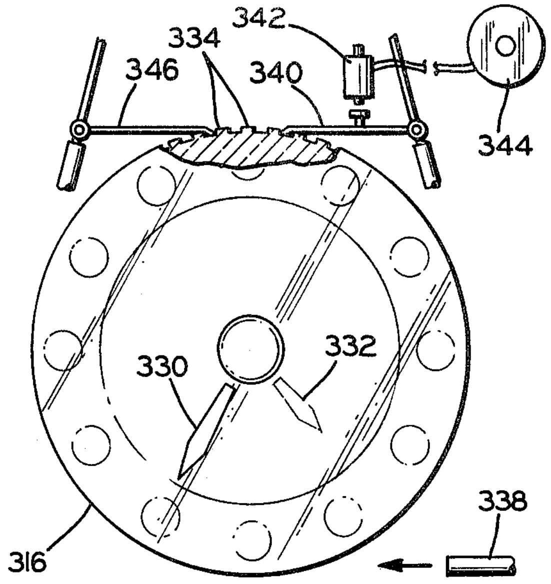
FIG. 12 is a fragmentary view in elevation of the clock of FIG. 11.
Figure 13:
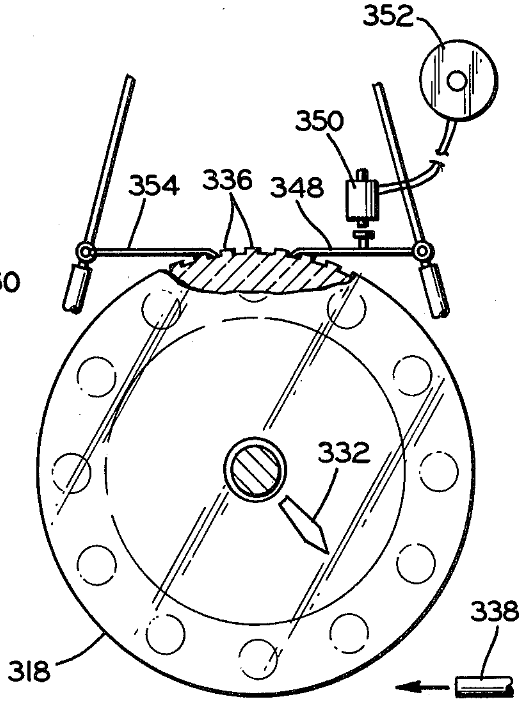
FIG. 13 is a fragmentary view in elevation of parts of the clock of FIG. 11.

The center disc 288 can have a circular plate 326 (FIG. 14) imbedded therein which is opaque, and outer holes or circular indicia 328 (FIG. 11) to indicate the hours on the clock. The minute discs 316 have minute hands 330 (FIG. 12) and the hour discs have hour hands 332 (FIGS. 12 and 13).

In very large clocks, for example with discs having diameters in the order of four feet, inertia causes the discs to tend to stay in a vertical position during oscillating movement. Consequently, when the dials move from left to right the inertia tends to cause the moveable dial to move in a clockwise direction relative to the supporting disc, and vice versa. Consequently, backlash dogs could be employed to engage teeth 334 and 336 on the minute and hour discs 316 and 318 to enable the discs to rotate in a clockwise direction as the movement of the discs in the arcuate path is from right to left but to prevent movement in a counterclockwise direction as the movement of the discs is from left to right. However, this requires that the pendulum movement be synchronous with the time.

For independent movement of the minute and hour discs 316 and 318, a lower air jet 338 can be employed to constantly urge the discs 316 and 318 in clockwise directions during all oscillatory movement thereof. As shown in FIG. 12, the minute disc has a gate dog 340 which prevents such movement until lifted by a solenoid 342 operated through a synchronous timer 344.

The gate dog 340 can be appropriately designed to assure that the disc will advance only one tooth each time it is lifted. Other means can be employed, such as hydraulics or air, to cause the movement of the gate. The gate is preferably lifted as the dial moves from right to left in which instance the inertia tends to supplement the air jet and less air is required. A backlash dog 346 prevents undesirable counterclockwise movement of the disc during left-right arcuate movement of the discs.

Figure 14:
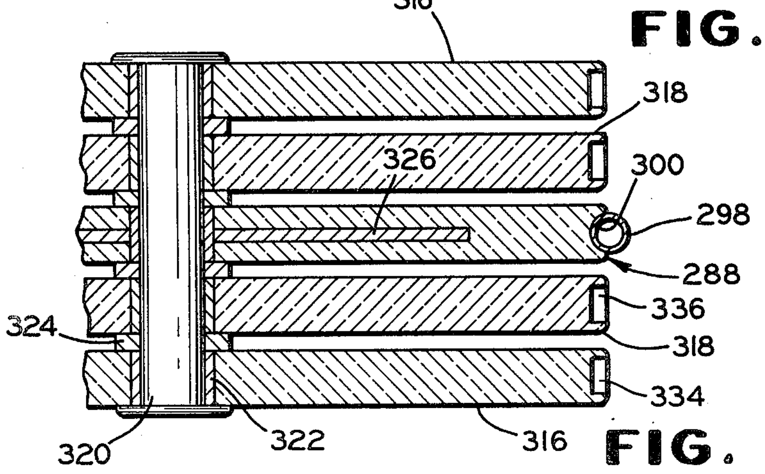
FIG. 14 is a fragmentary view in section of dials of the clock of FIGS. 11–13.

The air from the jet 338 can also enter between the adjacent discs, particularly when the edges are rounded, as shown in FIG. 14, to provide an air-bearing effect to separate the discs and enable them to rotate more easily.

As shown in FIG. 13, the hour disc 318 has a similar gate dog 348, a solenoid 350, and a synchronous timer 352, along with a backlash dog 354.

The components for advancing the minute and hour discs on one side are the same as on the other side, being in a mirror image relationship. The circular hour indicia 328 on the center supporting disc 288 are visible on both sides while the minute and hour hands 330 and 332 on one side are hidden from the other side by the circular plate 326 in the disc 288.

To cause the pendulum movement of the discs 288, 316, and 318, the fluid supply means 292 includes a supply tube 356 of arcuate shape with an upper end communicating with the end 294 of the member 290, with a lower end 358 being bent vertically with a squared-off opening. A second supply tube 360 has an upper end communicating with the upper end 296 of the member 290, with a lower end 362 being bent vertically with a squared-off opening. The lower ends 358 and 362 of the supply tubes 356 and 360 receive fluid, preferably air, from a supply nozzle 364. The ends of the tubes are crossed so that air is supplied through the tube 356 when the discs are left of center and air is supplied through the tube 360 when the discs are right of center. This air acts on liquid 364 in the hollow member 390 to cause the oscillatory movement in the arcuate path of the discs, with the components being supported by the fulcrum blade 312 on the fulcrum plate 314.

Of course, the various components including the lower jet 338 and the nozzle 368 along with the lower ends of the supply tubes 356 and 360 are hidden by the frame or cabinet for the clock. The various gates and dogs along with the solenoids are small and not readily apparent to the observer, particularly with large clocks located in large spaces.

Various modifications of the above-described embodiments of the invention will be apparent to those skilled in the art, and it is to be understood that such modifications can be made without departing from the scope of the invention, if they are within the spirit and the tenor of the accompanying claims.

I claim:

1. Apparatus for moving an object in an arcuate path, said apparatus comprising an object, an elongate tube having a generally U-shaped portion, said U-shaped portion being engagable with and supporting said object, means for supporting said elongate tube for pivotal movement in an arcuate path, and means for supplying fluid in pulses to said elongate tube on one side of said U-shaped portion with the fluid moving toward said U-shaped portion when entering said tube to cause said object and said U-shaped portion to move together back and forth in the arcuate path.

2. Apparatus according to claim 1 characterized by said elongate tube being rigid.

3. Apparatus according to claim 1 characterized by an additional article, and means positioning said additional article such that it is contacted by said object each time said object reaches one end of the arcuate path.

4. Apparatus according to claim 1 characterized by said elongate tube being flexible.

5. Apparatus according to claim 4 characterized by said pivotal supporting means comprising rigid tube means connected to said elongate tube and extending toward said fluid supplying means.

6. Apparatus according to claim 1 characterized by at least a substantial portion of said U-shaped portion lying in a generally vertical plane.

7. Apparatus according to claim 1 characterized by at least a substantial portion of said U-shaped portion lying in a generally horizontal plane.

8. Apparatus according to claim 6 characterized by at least a portion of said U-shaped portion containing liquid.

9. Apparatus according to claim 8 characterized by at least the substantial portion of said U-shaped portion being filled with liquid.

10. Apparatus according to claim 8 characterized by said object being of cylindrical shape and supported by at least the substantial portion of said U-shaped portion of said elongate tube.

11. Apparatus according to claim 1 characterized by said elongate tube having a supply end on one side of said U-shaped portion and said fluid supplying means supplying fluid to the supply end of said hollow member.

12. Apparatus according to claim 11 characterized by said elongate tube having a receiving end on the side of said U-shaped portion opposite said supply end.

13. Apparatus according to claim 12 characterized by said receiving end of said elongate tube is open to exhaust fluid therefrom.

14. Apparatus according to claim 12 wherein said receiving end of said elongate tube is closed.

15. Apparatus for moving an object is an oscillatory manner in an arcuate path, said apparatus comprising an elongate tube having two ends and a non-lineal portion therebetween with the non-lineal porton being engagable with the object, means movably supporting at least one end portion of said elongate tube on one side of said non-lineal portion to enable said non-lineal portion to move in an arcuate path, and means for supplying fluid intermittently at an increasing rate of flow and then at a decreasing rate of flow to said elongate tube on one side of said non-lineal portion with the fluid moving toward said non-lineal portion when entering said elongate tube and as the rate of flow increases to cause said U-shaped portion and said object to move together in an arcuate path.

16. Apparatus according to claim 15 characterized by said fluid supply means supplying the fluid to said elongate tube at uniform intervals.

17. Apparatus according to claim 15 characterized by said non-lineal portion of said elongate tube being generally of U-shaped configuration.

18. Apparatus according to claim 15 characterized by said non-lineal portion of said elongate tube containing a liquid, and the fluid supplied by said fluid supply means being a gas.

19. A clock comprising an elongate hollow member having end portions and a lower curved portion, means movably supporting said end portions, a supporting member carried by the curved portion of said hollow member, a rotatable hour-indicating member, a rotatable minute-indicating member, means supporting said rotatable members in parallel relationship from said supporting member, means for supplying fluid intermittently to at least one end portion of said hollow member with the fluid moving toward said curved portion when entering said hollow member, means for rotating said minute-indicating member relative to said supporting member at a predetermined rate, and means for rotating said hour-indicating member relative to said supporting member at a predetermined rate as said supporting member and said rotatable members move in an arcuate path with said hollow member under the influence of the supplied fluid.

20. A clock according to claim 19 characterized by said fluid supplying means also includes means for supplying fluid intermittently to the other end portion of said hollow member on the other side of said curved portion alternately with the fluid supplied to the hollow member through the one end portion of said hollow member.

21. A clock according to claim 19 wherein said means for rotating said minute-indicating member at a predetermined rate rotates said minute-indicating member independently of the movement of said supporting member and said rotatable members in the arcuate path.

22. A clock according to claim 19 wherein said means for rotating said hour-indicating member at a predetermined rate rotates said hour-indicating member independently of the movement of said supporting member and said rotatable members in the arcuate path.

23. A clock according to claim 19 characterized by said movable supporting means comprising a fulcrum located above said supporting member and said rotatable members, and means connecting said hollow member with said fulcrum.

24. A clock according to claim 23 characterized by said fluid-supplying means comprising means forming a first chamber communicating with said one end portion of said hollow member and forming a second chamber communicating with said other end portion of said hollow member, and a source of fluid under pressure which supplies fluid first to one of said chambers and then to the other of said chambers.

25. A clock according to claim 24 characterized by said chamber forming means being movable in an arcuate path in directions opposite to the movement of said supporting member and said rotatable members.

26. A clock according to claim 19 characterized by said fluid-supplying means comprising a tube connected with said one end portion of said hollow member, extending below said curved portion, and opening in a downward direction, and nozzle means forming an upwardly-directed flow of fluid, with the open end of said tube being in alignment with said nozzle means at intervals as said supply tube moves in an arcuate path with said supporting member and said rotatable members.

27. A clock according to claim 26 characterized by said fluid supplying means further comprising a second tube connected with said other end portion of said hollow member, extending below said curved portion, and opening in a downward direction, and the open end of said second tube being in alignment with said nozzle means at intervals as said second tube moves in an arcuate path with said supporting member and said rotatable members.

28. A clock according to claim 19 characterized by said supporting member and said rotatable members being circular, and said rotatable members being made of a substantially transparent material.

29. A clock according to claim 19 characterized by said rotatable members being made of substantially transparent material, an additional rotatable hour-indicating member, an additional rotatable minute-indicating member, said additional members being made of substantially transparent material, and said means supporting for said rotatable members supporting said members on one side of said supporting member and supporting said additional members on the other side of said supporting member.

30. A clock comprising an elongate pendulum member having an upper end portion and a lower portion, means pivotally supporting the upper end portion of said elongate member, means for swinging said elongate pendulum member to and fro, a rotatable minute-indicating member, a rotatable hour-indicating member, means rotatably supporting said rotatable members in parallel relationship from said elongate member, means for rotating said minute-indicating member relative to said supporting means at a predetermined rate, means for rotating said hour-indicating member relative to said supporting means at a predetermined rate, said supporting means comprising said lower portion of said elongate member being curved, and a supporting member carried by said curved portion of said elongate member and rotatably supporting said minute-indicating member and said hour-indicating member.

31. A clock according to claim 30 wherein said means for rotating said minute-indicating member at a predetermined rate rotates said minute-indicating member independently of the movement of said elongate pendulum member and said means for rotating said hour-indicating member at a predetermined rate rotates said hour-indicating member independently of the movement of said elongate pendulum member.

32. A clock according to claim 30 characterized by said minute-indicating member being located on one side of said supporting member and said hour-indicating member being located on the other side of said supporting member.

33. A clock comprising an elongate pendulum member having an upper end portion and a lower portion, means pivotally supporting the upper end portion of said elongate member, means for swinging said elongate pendulum member to and fro, a rotatable minute-indicating member, a rotatable hour-indicating member, means rotatably supporting said rotatable members in parallel relationship from said elongate member, means for rotating said minute-indicating member relative to said supporting means at a predetermined rate, means for rotating said hour-indicating member relative to said supporting means at a predetermined rate, said pendulum swinging means comprising said elongate pendulum member being hollow and of generally U-shaped configuration, and fluid-supply means for supplying fluid to an end portion of said hollow member.

* * * * *

UNITED STATES PATENT OFFICE
CERTIFICATE OF CORRECTION

PATENT NO. : 4,455,094
DATED : June 19, 1984
INVENTOR(S) : Robert G. Russell

It is certified that error appears in the above-identified patent and that said Letters Patent are hereby corrected as shown below:

In the specification:

Column 1, line 66, "diminising" should be --diminishing--.
Column 4, line 43, "p" should be deleted and "The U-shaped" should begin a new paragraph.
Column 5, line 41, "to" should be --of--.

In the claims:

Claim 9, line 1, "8" should be --7--.
Claim 10, line 1, "8" should be --7--.

Claim 13, line 2, "is" should be --being--.
Claim 15, line 1, "is" should be --in--.
Claim 15, line 4, "porton" should be --portion--.

Signed and Sealed this

*Fifth* Day of *March 1985*

[SEAL]

*Attest:*

DONALD J. QUIGG

*Attesting Officer* *Acting Commissioner of Patents and Trademarks*

UNITED STATES PATENT OFFICE
CERTIFICATE OF CORRECTION

PATENT NO. : 4,455,094

DATED : June 19, 1984

INVENTOR(X) : Robert G. Russell

It is certified that error appears in the above-identified patent and that said Letters Patent are hereby corrected as shown below:

In the claims:

Claim 11, lines 4 and 5, "hollow member" should be --elongate tube--.

Signed and Sealed this

*Ninth* Day of *July 1985*

[SEAL]

*Attest:*

DONALD J. QUIGG

*Attesting Officer*

*Acting Commissioner of Patents and Trademarks*